US012615741B2

(12) United States Patent　　　　　　(10) Patent No.:　US 12,615,741 B2
Tseng et al.　　　　　　　　　　　　　(45) Date of Patent:　　Apr. 28, 2026

(54) BLIND-MATING FLOATING CLAMP DEVICE

(71) Applicant: HANWIT PRECISION INDUSTRIES LTD., New Taipei (TW)

(72) Inventors: Ying-Chih Tseng, New Taipei (TW); Ming-De Wu, New Taipei (TW); Ching-Kai Chang, New Taipei (TW)

(73) Assignee: HANWIT PRECISION INDUSTRIES LTD., New Taipei City (TW)

( * ) Notice: Subject to any disclaimer, the term of this patent is extended or adjusted under 35 U.S.C. 154(b) by 215 days.

(21) Appl. No.: 18/541,292

(22) Filed: Dec. 15, 2023

(65) Prior Publication Data

US 2025/0203810 A1　　Jun. 19, 2025

(51) Int. Cl.
　*H05K 7/20*　　　(2006.01)
　*F16L 3/20*　　　(2006.01)
　*F16L 27/10*　　(2006.01)
　*F16L 37/086*　　(2006.01)
　*F16L 37/50*　　(2006.01)
(52) U.S. Cl.
　CPC ........... *H05K 7/20272* (2013.01); *F16L 3/20* (2013.01); *F16L 27/1017* (2013.01); *F16L 37/086* (2013.01); *F16L 37/50* (2013.01)
(58) Field of Classification Search
　CPC . F16L 3/20; F16L 3/205; F16L 3/2056; F16L 27/1017; F16L 37/086; F16L 37/50; H05K 7/20272
　See application file for complete search history.

(56) References Cited

U.S. PATENT DOCUMENTS

| | | | | |
|---|---|---|---|---|
| 2,647,770 | A * | 8/1953 | Tollefsbol | ........... F16L 27/1017 |
| 5,248,168 | A * | 9/1993 | Chichester | |
| 5,792,990 | A * | 8/1998 | Piero | |
| 10,422,190 | B2 * | 9/2019 | Morrison | .............. F16L 37/086 |
| 11,009,167 | B2 * | 5/2021 | Rapien | .................... F16L 37/50 |
| 11,473,486 | B2 * | 10/2022 | Huang | ................ F16L 27/1017 |
| 11,892,252 | B2 * | 2/2024 | Yang | ................. H05K 7/20272 |
| 12,241,698 | B2 * | 3/2025 | Lin | .................... H05K 7/20272 |
| 12,338,922 | B2 * | 6/2025 | Marquis | ................. F16L 37/52 |
| 2023/0358352 | A1 * | 11/2023 | Thielemann | |

* cited by examiner

*Primary Examiner* — William S. Choi
(74) *Attorney, Agent, or Firm* — MUNCY, GEISSLER, OLDS & LOWE, P.C.

(57)　　　　　　　ABSTRACT

A blind-mating floating clamp device includes a device body having two opposite side surfaces respectively provided a through hole penetrating the inside of the device body, and an elastic member assembled inside the device body, and a quick connector with the shank thereof movably inserted into the through holes of the device body. The diameter of each through hole is larger than the inner diameter of the elastic member or smaller than the outer diameter of the elastic member. The shank of the quick connector is movably held at the inner diameter of the elastic member, so that the docking portion located in the shank can be assembled with a corresponding preset adapter. It achieves elastic floating offset, rapid adjustment, convenient assembly and docking purposes, and the quick connector application is not easily restricted by the installation position.

9 Claims, 11 Drawing Sheets

BLIND-MATING FLOATING CLAMP DEVICE

BACKGROUND OF THE INVENTION

1. Field of the Invention

The present invention provides a blind-mating floating clamp device, especially a quick connector that can float for offset and swing docking, wherein the inner diameter of the elastic member inside the device body is used for floating assembly of the shank of the quick connector, so that the quick connector has a flexible floating adjustment space, and can achieve floating offset and adjustment docking with the preset adapter.

2. Description of the Related Art

With the vigorous development of the electronics industry, various electronic and electrical products are widely used. When various electronic and electrical products are used, various processors, electronic components, etc. are prone to generate high-temperature heat. If heat is not dissipated, the performance of the electronic and electrical products will be affected. Generally common heat dissipation methods in electronic and electrical products use cooling fins or cooling fans to assist electronic and electrical products in dissipating heat. However, as various electronic and electrical products are designed to be light, thin, short and small, the available space inside the electronic and electrical products is also gradually reduced, and larger cooling fins, cooling fans, etc. used for heat dissipation are not easily used in small electronic and electrical products. Therefore, it is replaced by a smaller water (liquid) cooling system, which performs cold and heat exchange through the circulation of water (liquid) to achieve rapid heat dissipation and cooling.

As for the water (liquid) cooling system currently used, the heat exchanger assembled in electronic and electrical products has a water (liquid) flow channel inside, which must be connected to the external water (liquid) circulation system to achieve the effect of water (liquid) flow for hot and cold exchange. That is to say, it is necessary to connect the water (liquid) heat exchanger and the water (liquid) circulation system through pipelines so that the water (liquid) can circulate quickly. Usually, adapters are used to connect and conduct the connection between the connected pipelines, the water (liquid) heat exchanger and the water (liquid) circulation system. And various adapters are directly fixed on various water (liquid) heat exchangers and water (liquid) circulation systems, and cannot be moved or adjusted. As a result, when assembling the adapters on the water (liquid) heat exchanger and the water (liquid) circulation system and the adapters on the pipelines, they must be at a fixed distance and range before assembly can be accurately aligned. If there is a slight deviation in the position, assembly cannot be performed. It is necessary to replace the relative adapters that meet various distances for correct alignment and assembly. If it is assembled reluctantly, it will cause pulling and twisting between various pipes and adapters, which will easily affect the flow of water (liquid) or be blocked, and will affect the heat dissipation effect and even lead to inconvenience in assembly operations and cause trouble to construction workers.

Therefore, how to solve the inconvenient problems and troubles such as the inability to adjust the connection of the adapter when assembling the current water (liquid) heat exchanger and the water (liquid) circulation system, and the defects that it is easy to affect the heat dissipation effect of electronic and electrical products, that is the direction that relevant manufacturers in this industry are eager to study and improve.

SUMMARY OF THE INVENTION

In view of the above-mentioned problems and deficiencies, the inventor of the present invention collected relevant information, evaluated and considered it from many parties, and used his many years of experience accumulated in this industry to design this blind-mating floating clamp device.

The main object of the present invention is that the blind-mating floating clamp device is assembled with an elastic member inside the device body, and the two side surfaces of the device body are respectively provided with through holes penetrating the inside of the device body, and the diameter of each through hole is larger than the inner diameter of the elastic member, or can be smaller than the outer diameter of the elastic member, so the elastic member can form an elastic floating active displacement at the device body. It achieves the effect of flexible floating (in axial, radial or unspecified directions) offset, quick adjustment, easy assembly and docking, and is not easily restricted by the direction, angle or space of the installation location during application.

Another important object of the present invention is that the blind-mating floating clamp device is assembled with an elastic member inside the device body, and the two side surfaces of the device body are respectively provided with through holes penetrating the inside of the device body, and the diameter of each through hole is larger than the inner diameter of the elastic member, or can be smaller than the outer diameter of the elastic member, and each through hole on the two side surfaces of device body is provided with the shank of a quick connector, which is movably held at the inner diameter of the elastic member, so that the docking portion located in the shank can be assembled with a corresponding preset adapter, so that the quick connector can form an elastic floating active displacement at the device body to achieve elastic floating (in axial, radial or unspecified directions) offset, rapid adjustment, convenient assembly and docking, and enable the quick connector application to be not easily restricted by the installation position.

Still another important object of the present invention is that the device body of the blind-mating floating clamp device comprises a base, two outer covers respectively assembled on two opposite surfaces of the base, and an accommodation space is provided inside the base for assembling an elastic member. The two outer covers are respectively provided with a through hole. The diameter of each through hole is smaller than the diameter width of the accommodation space, larger than the inner diameter of the elastic member, or smaller than the outer diameter of the elastic member. Moreover, the base comprises a plurality of positioning holes and positioning notches respectively located at corners thereof for assembling and positioning in a preset device. The first outer cover comprises a plurality of first positioning holes and first positioning notches respectively located at corners thereof and respectively corresponding to the positioning holes and positioning notches of the base. The second outer cover comprises a plurality of second positioning holes respectively located at corners thereof and respectively corresponding to the positioning holes and positioning notches of the base and the first positioning holes and first positioning notches of the base.

Still another important object of the present invention is that the elastic member inside the device body is a curved elastic piece that can be continuously curved, convex, or concave, and is interference-supported on the inner wall of the accommodation space. The elastic member can also be a spring piece in a continuous arc-convex, concave, regular or irregular flower-shaped curve, a regular or irregular cloud-shaped curve, or a regular or irregular geometric curve, and is elastically held in an interference manner on the inner wall surface of the accommodation space of the base of the device body.

Still another important object of the present invention is that the blind-mating floating clamp device comprises a connector body with a shank and a limiting member assembled on one side of the connector body. The limiting member is located outside the through hole on one side of the device body. The connector body has an annular flange on one end of the shank to expose the outside of the base, and a connecting portion on the other end for the limiting member to assemble and combine. The limiting member assembled on the annular flange and the connecting portion is clamped on the outside of the two sides of the through hole of the device body, and allows the shank to be movable through the through hole and resist the inner diameter of the elastic member. The connecting portion on one end of the shank of the connector body and the limiting member can be assembled and combined through thread locking, tight fitting or interference fitting assembly, or welding.

DETAILED DESCRIPTION OF THE PREFERRED EMBODIMENT

In order to achieve the above objects and effects, the technical means adopted by the present invention, their structures and implementation methods, the characteristics and functions of the preferred embodiments of the present invention are described in detail below with the annexed drawings to facilitate a complete understanding.

Figure 1:
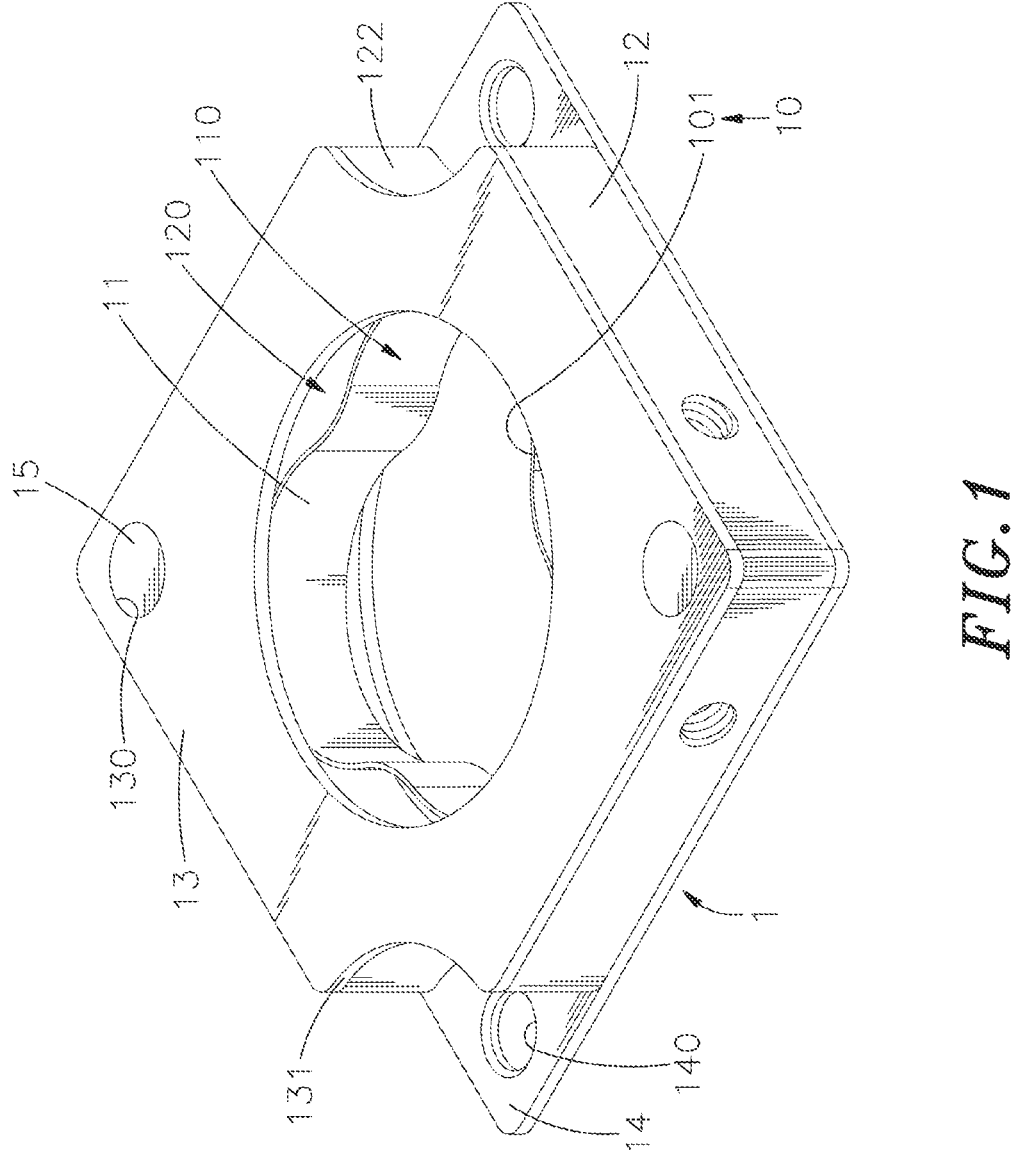
FIG. 1 is a three-dimensional appearance view of the first embodiment of the present invention.
Figure 2:
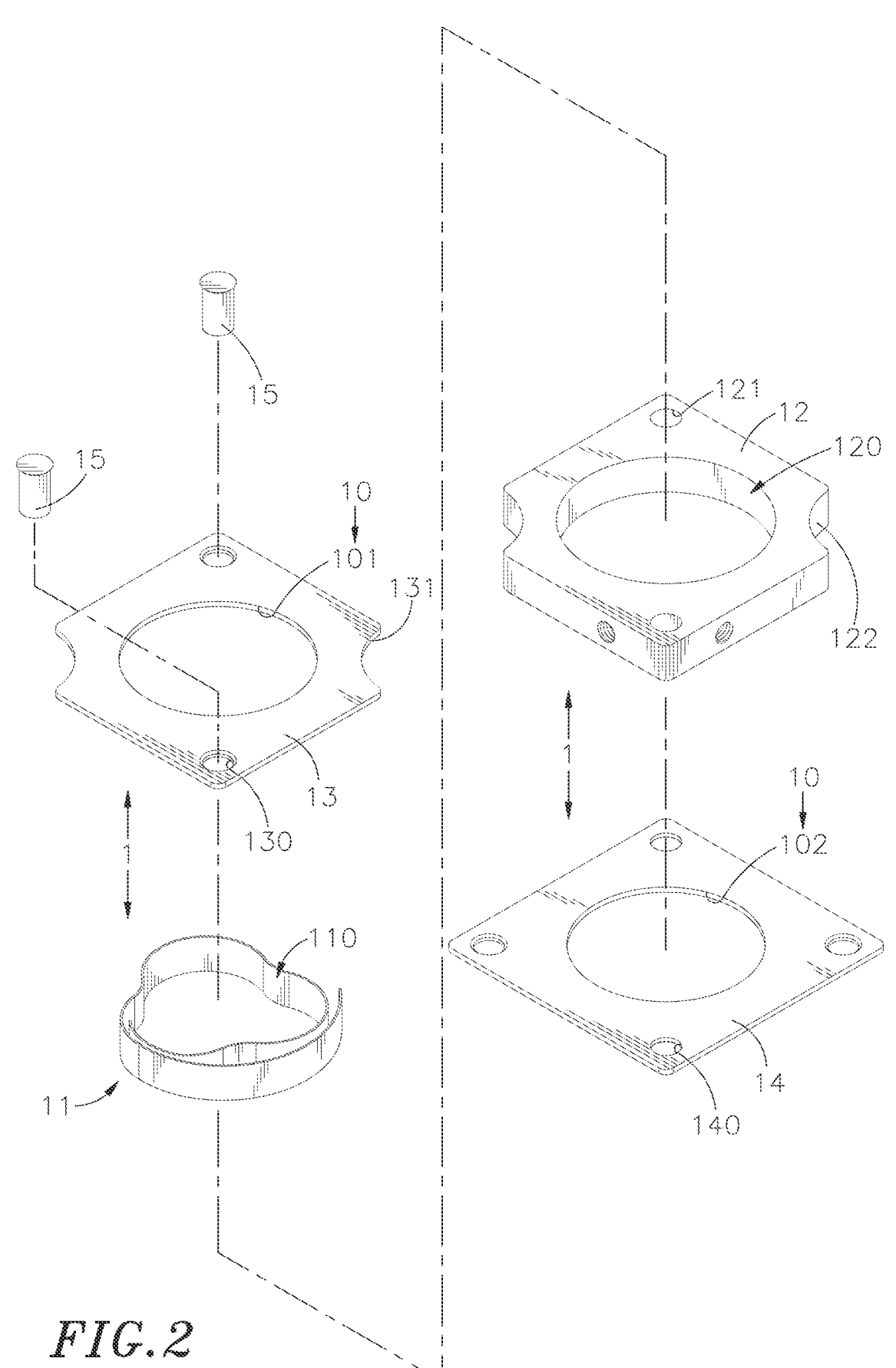
FIG. 2 is an exploded perspective view of the first embodiment of the present invention.
Figure 3:
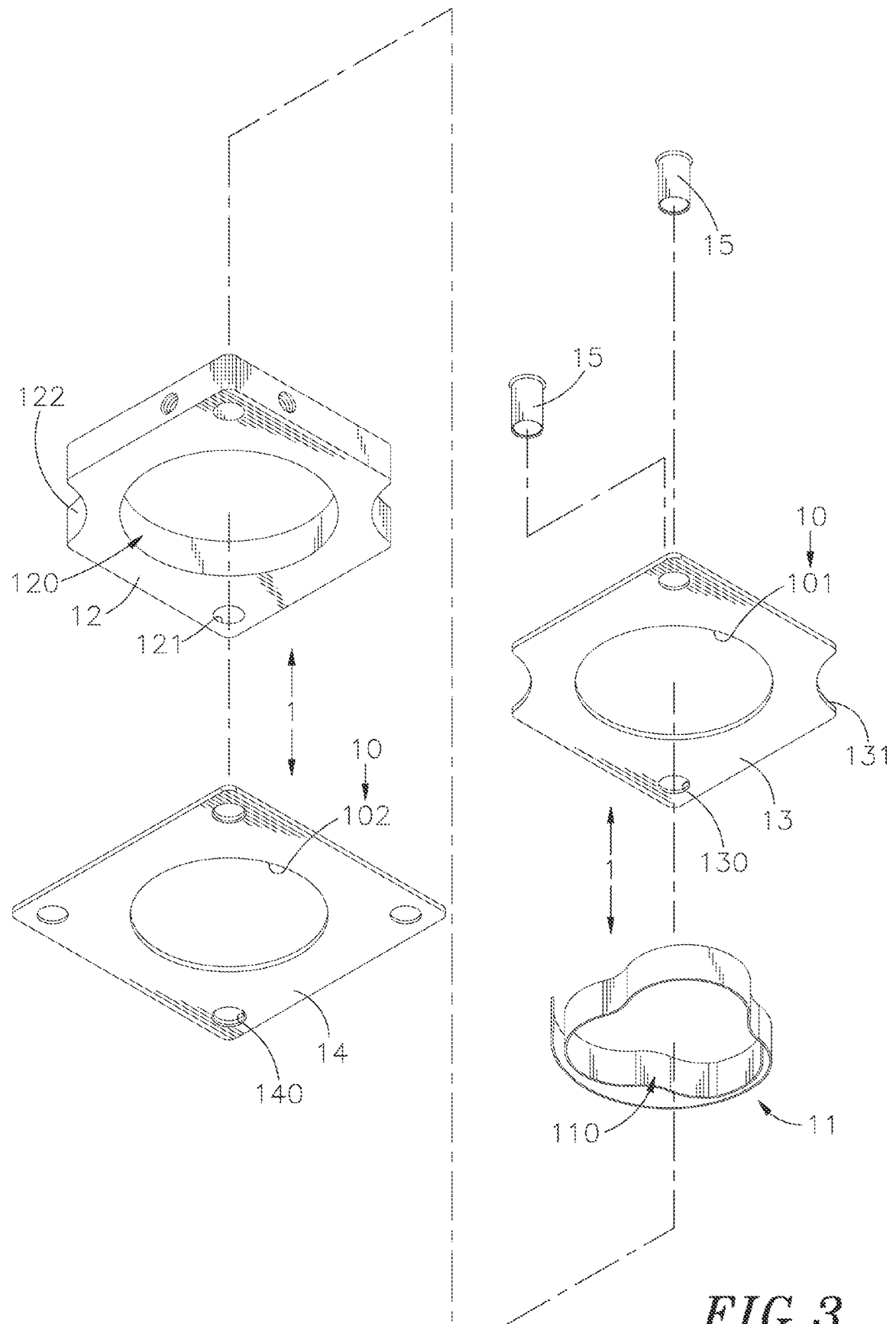
FIG. 3 is an exploded perspective view from another direction of the first embodiment of the present invention.
Figure 4:
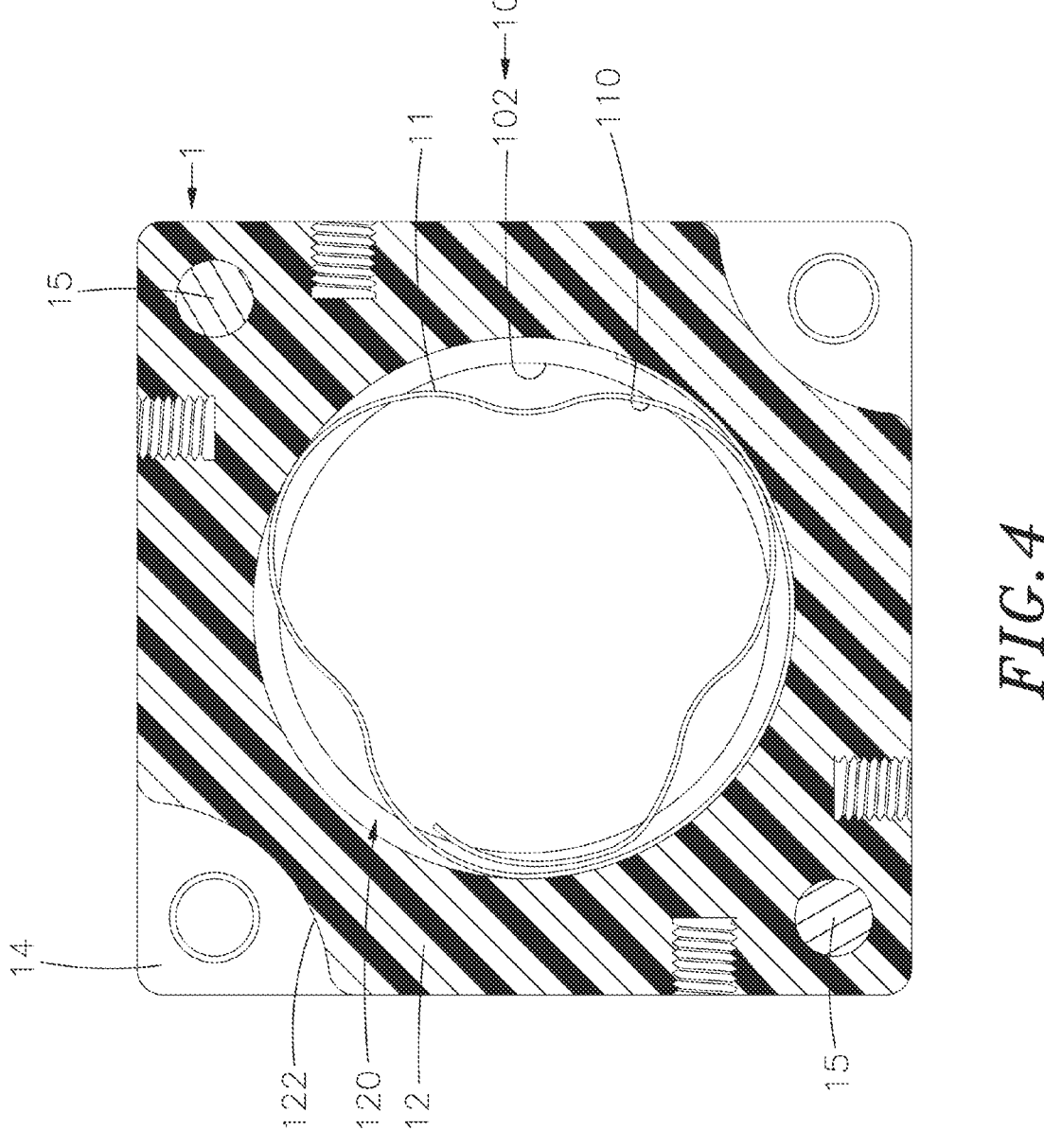
FIG. 4 is a top cross-sectional view of the first embodiment of the present invention.
Figure 5:
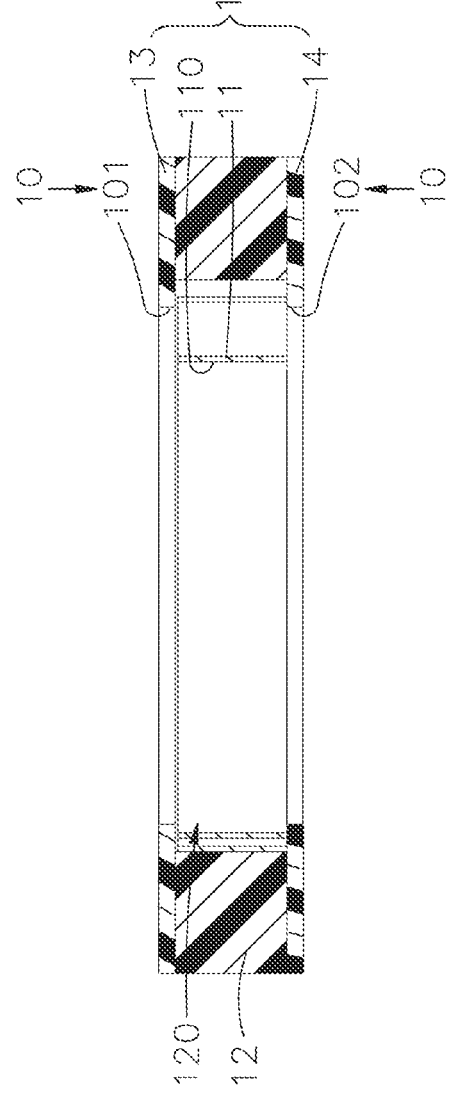
FIG. 5 is a side cross-sectional view of the first embodiment of the present invention.

Referring to FIGS. 1-5. It can be clearly seen from the figures that the blind-mating floating clamp device of the present invention comprises a device body 1.

The device body 1 is internally assembled with an elastic member 11, and two side surfaces are respectively provided with through holes 10 penetrating the device body 1, and the diameter of each through hole 10 is larger than the inner diameter 110 of the elastic member 11, or may be smaller than the outer diameter of the elastic member 11.

Figure 6:
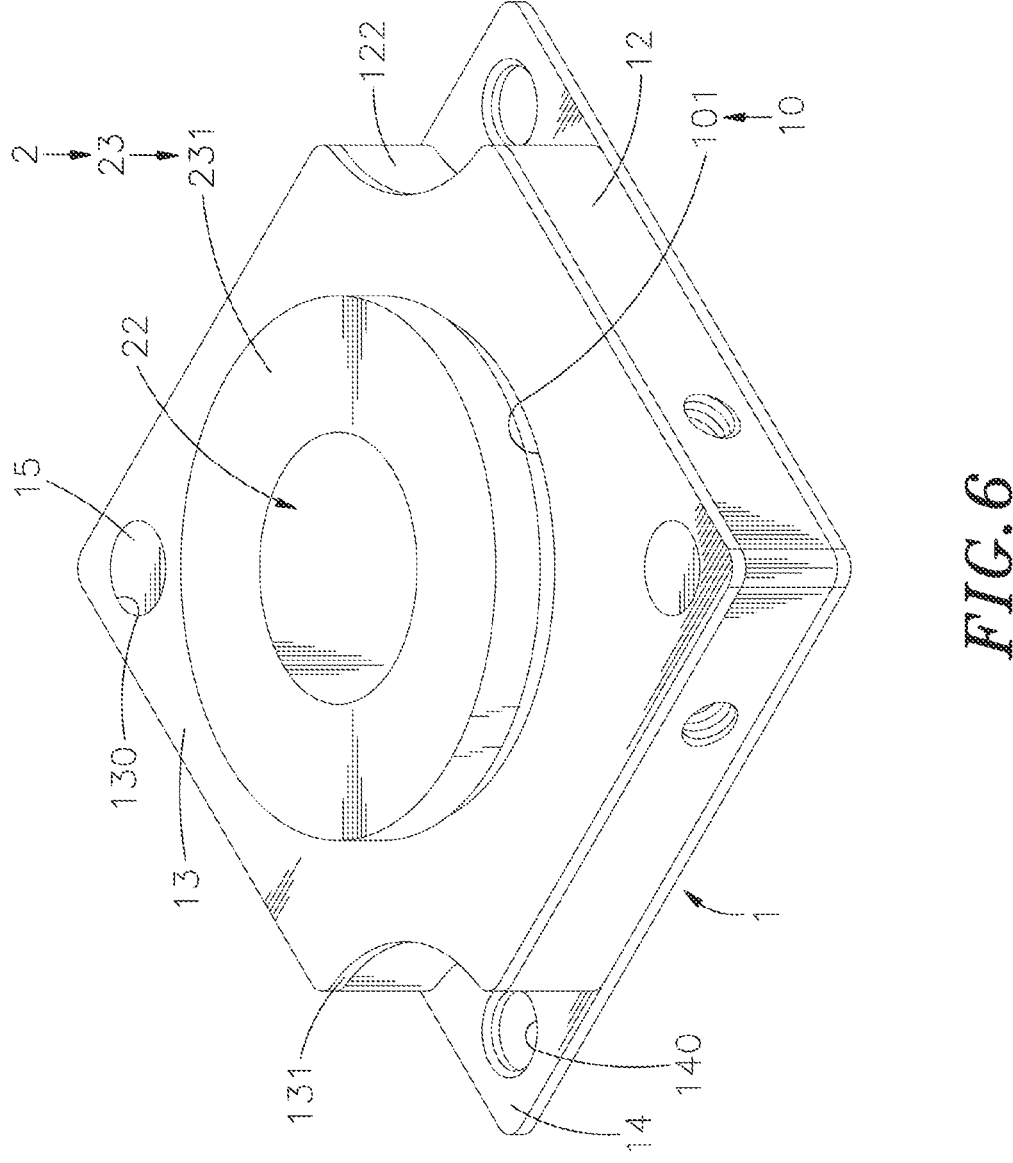
FIG. 6 is a three-dimensional appearance view of the second embodiment of the present invention.
Figure 7:
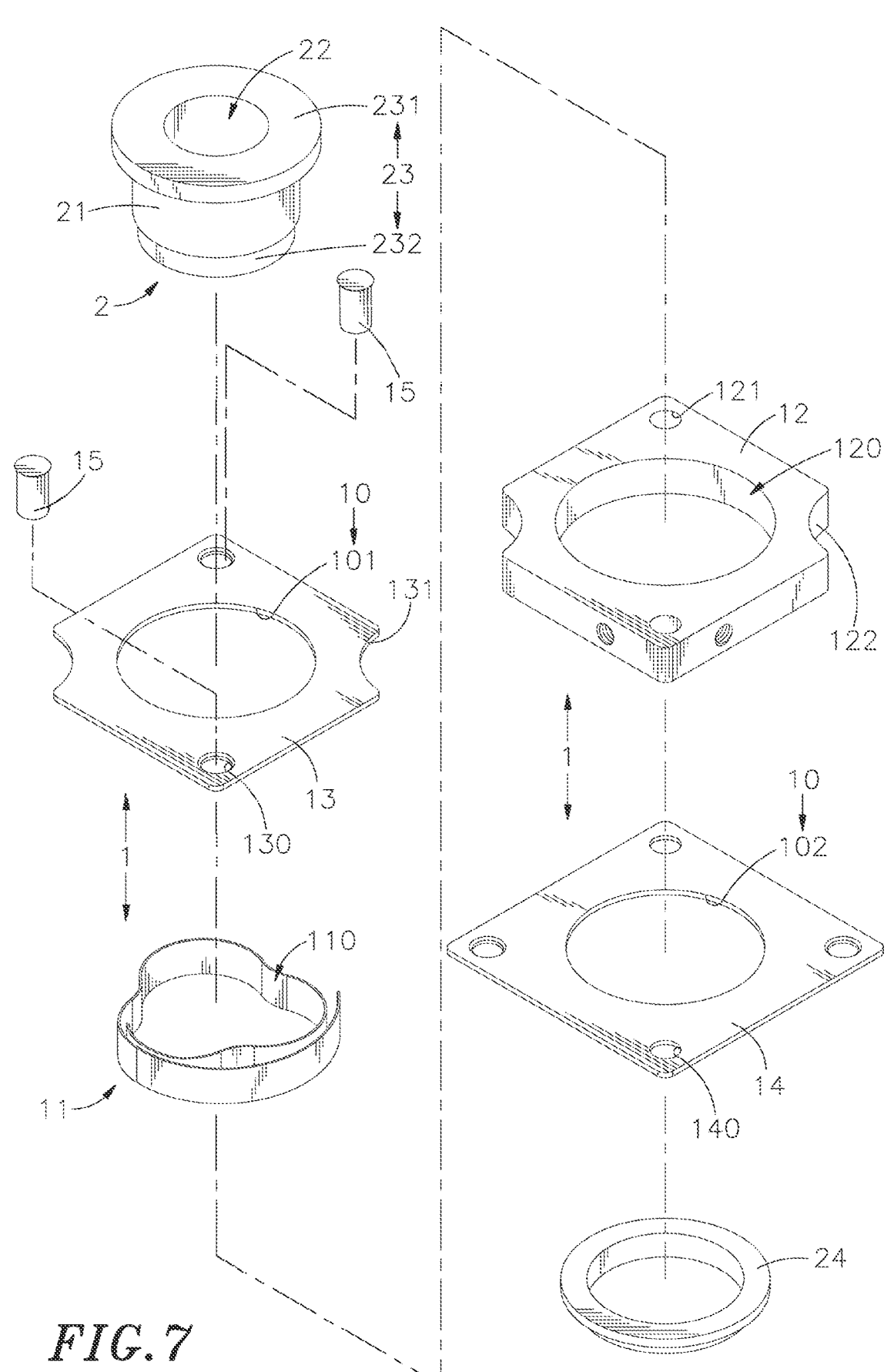
FIG. 7 is an exploded perspective view of the second embodiment of the present invention.
Figure 8:
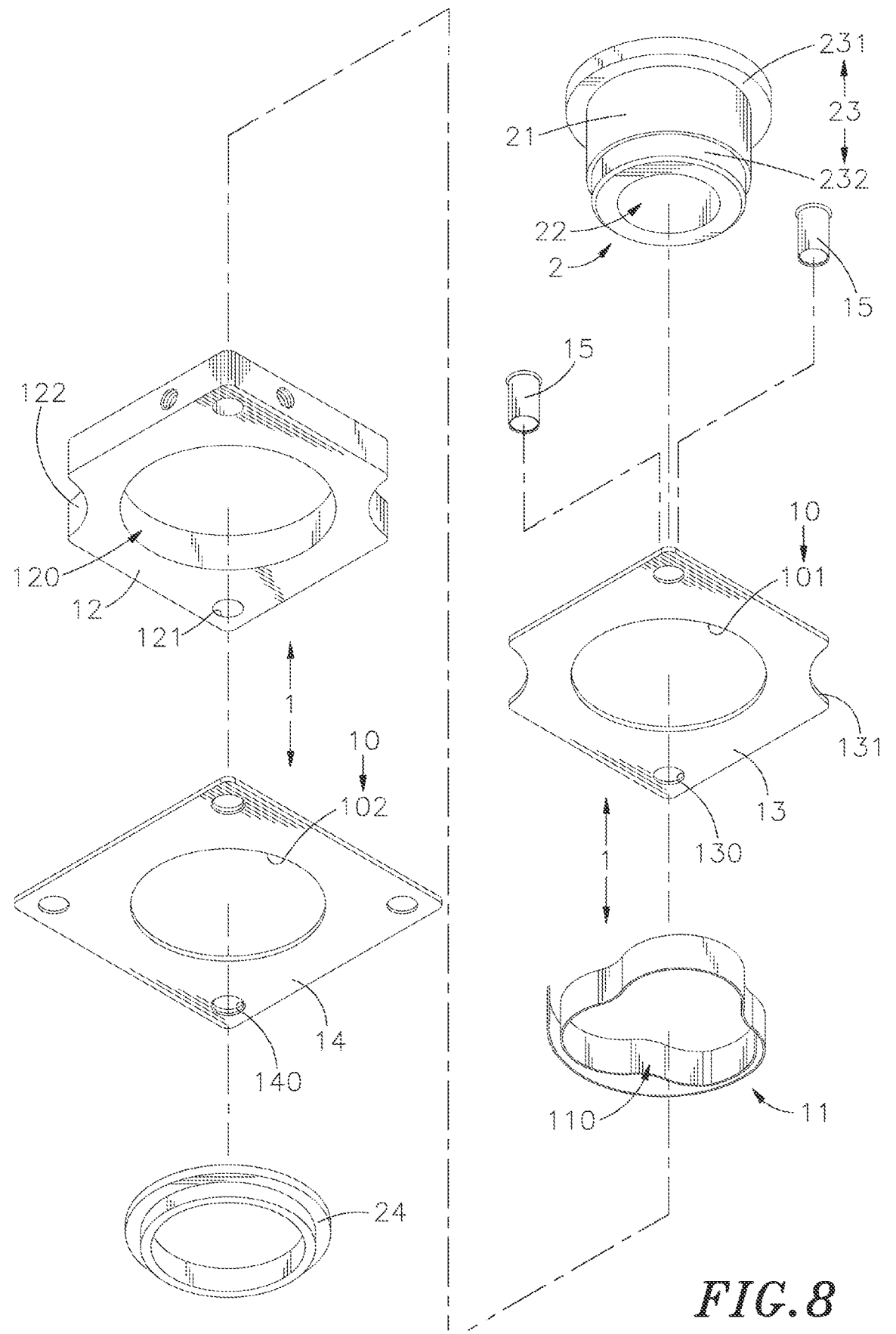
FIG. 8 is an exploded perspective view from another direction of the second embodiment of the present invention.
Figure 9:
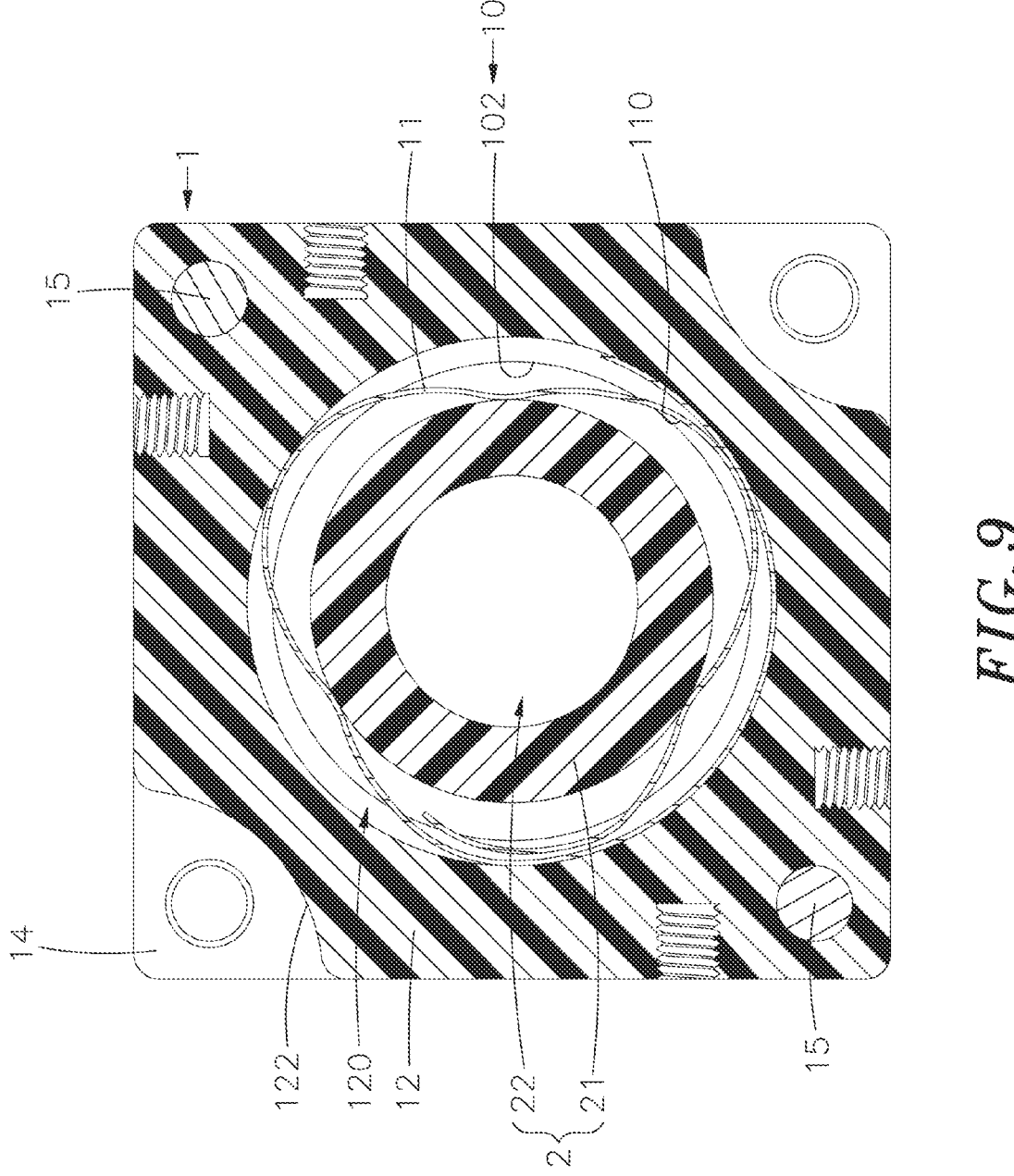
FIG. 9 is a top cross-sectional view of the second embodiment of the present invention.
Figure 10:
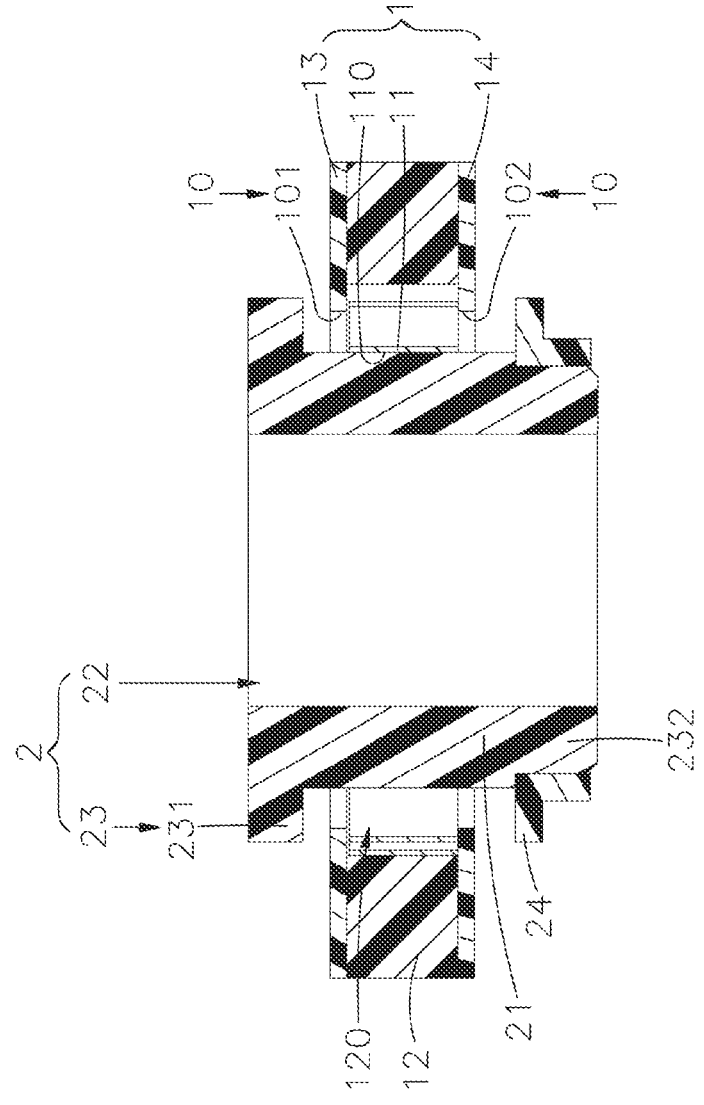
FIG. 10 is a side cross-sectional view of the second embodiment of the present invention.
Figure 11:
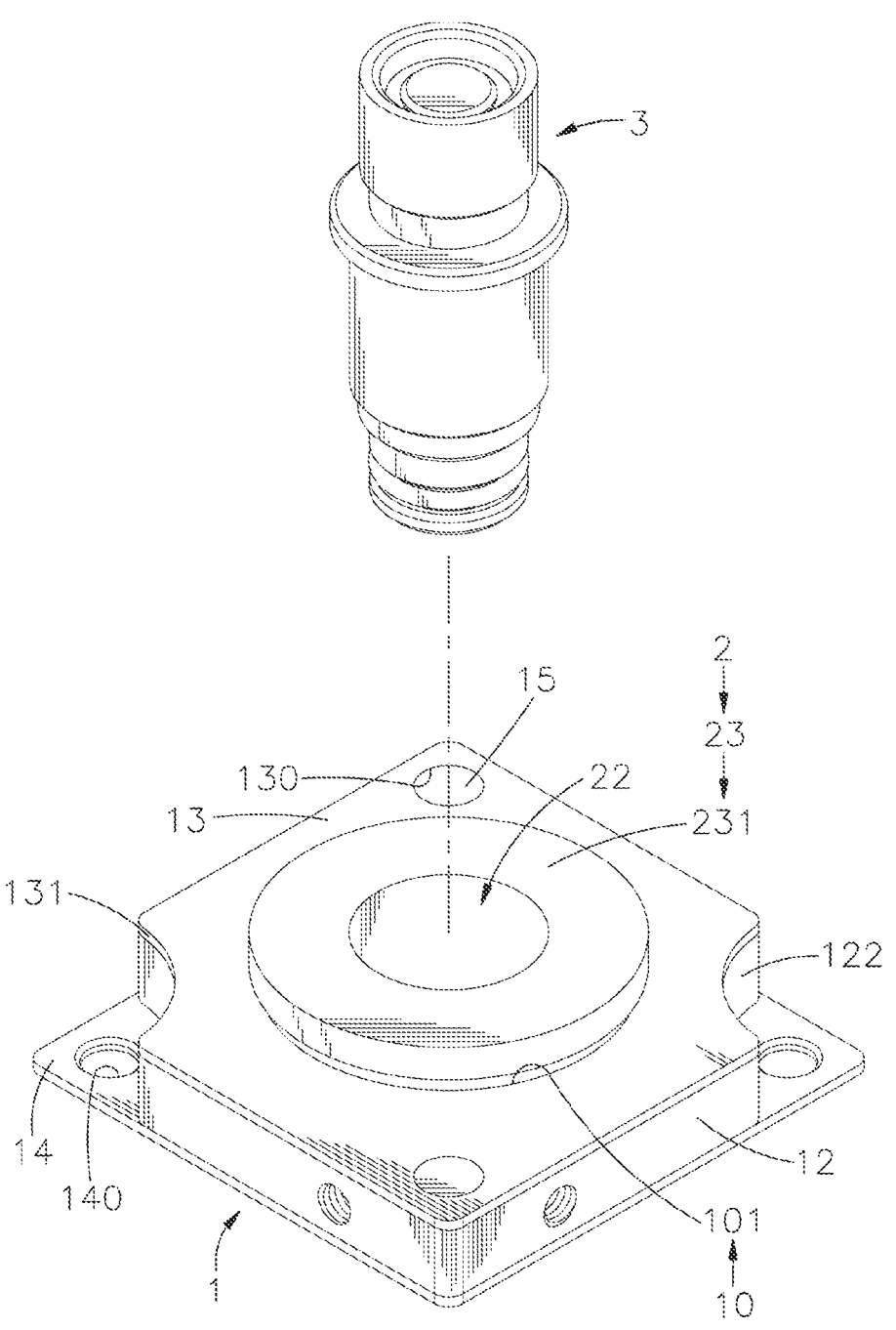
FIG. 11 is a three-dimensional exploded view of the docking method of the preferred embodiment of the present invention.

Please refer to FIGS. 1 to 5 and FIGS. 6 to 11 again. From what is shown in each figure, it can be clearly seen that the blind-mating floating clamp device of the present invention further comprises a device body 1 and a quick connector 2.

The device body 1 is internally assembled with an elastic member 11, and two side surfaces are respectively provided with through holes 10 penetrating the device body 1, and the diameter of each through hole 10 is larger than the inner diameter 110 of the elastic member 11, or may be smaller than the outer diameter of the elastic member 11.

The quick connector 2 is movably inserted into the through holes 10 on the two side surfaces of device body 1. It comprises a shank 21 and a docking portion 22 arranged in the shank 21. The shank 21 can be movably held at the inner diameter 110 of the elastic member 11 to form an interference-like conflict and connection, so that the docking portion 22 located in the shank 21 can be assembled with a corresponding preset adapter 3.

In addition, the device body 1 of the present invention comprises a base 12, a first outer cover 13 and a second outer cover 14 assembled on both surfaces of the base 12 (which can be assembled by welding, riveting or screw locking, etc). There is an accommodation space 120 inside the base 12 for assembling the elastic member 11. The first outer cover 13 is provided with a first through hole 101, and the second outer cover 14 is provided with a second through hole 102. The diameters of the first through hole 101 and the second through hole 102 are respectively smaller than the diameter width of the accommodation space 120 and the inner diameter 110 of the elastic member 11. Positioning holes 121 or positioning notches 122 can be provided at each corner of the base 12, which can be assembled and positioned in a preset device, which can be the mainframe, chassis or heat source (chip, processor or interface card) of electronic or electrical products (not shown in the figures). Each corner of the first outer cover 13 is provided with a first positioning hole 130 or a first positioning notch 131, which can be respectively aligned with each positioning hole 121. Each corner of the second outer cover 14 is provided with a second positioning hole 140 respectively. The second positioning holes 140 at the two diagonal corners can be respectively opposite to the positioning holes 121 and the first positioning holes 130. The second positioning holes 140 at the other two diagonal corners can respectively correspond to the positioning notches 122 and the first positioning notches 131.

The afore-mentioned base 12 of the device body 1 of the present invention is provided with a positioning hole 121 or a positioning notch 122 at each corner. The first positioning holes 130 of the first outer cover 13 and the second positioning holes 140 of the second outer cover 14 are aligned with the positioning holes 121 and positioning notches 122 and the first positioning holes 130 and first positioning notches 131 respectively, and at each first positioning hole 130, each first positioning notch 131, each positioning hole 121, each positioning notch 122 and each second positioning hole 140, positioning components 15 (such as screws, rivets or pins, etc.) can be used or welding methods can be used for the device body 1 to be fixed in a preset device, which can be the mainframe, chassis or heat source (chip, processor or interface card) of electronic or electrical products (not shown in the figures).

The elastic member 11 inside the device body 1 of the present invention can be in the form of a curved elastic piece with continuous arc-convex and concave bends, and the elastic member 11 is used to interfere with the inner wall surface of the accommodation space 120 of the base 12. In the preferred embodiment of the present invention, the elastic member 11 can be a spring piece in a continuous arc-convex, concave, regular or irregular flower-shaped curve, a regular or irregular cloud-shaped curve, or a regular or irregular geometric curve. It is elastically held in an interference manner on the inner wall surface of the accommodation space 120 of the base 12 of the device body 1.

Furthermore, the above-mentioned quick connector 2 of the present invention may comprise a connector body 23 with the above-mentioned shank 21, and a limiting member 24 assembled on one side of the connector body 23. The limiting member 24 is located outside the through hole 10 on one side of the device body 1. The connector body 23 is provided with an annular flange 231 on one end of the shank 21 to expose the outside of the base 12, and a connecting portion 232 on the other end for the limiting member 24 to be assembled and combined. The limiting member 24 assembled on the annular flange 231 and the connecting portion 232 is clamped on the outside of the two sides of the through hole 10 of the device body 1, and allows the shank 21 to be movable through the through holes 10 and resist the inner diameter 110 of the elastic member 11. The outer diameter of the shank 21 is less than or equal to or slightly larger than the inner diameter 110 of the elastic member 11, which can form an elastic floating offset (can be in the axial direction, radial direction or in an unspecified direction, etc). The connecting portion 232 and the limiting member 24 of the connector body 23 on one end of the shank 21 can be assembled and combined through thread locking, tight fitting or interference fitting assembly or welding.

When the floating device of the quick connector 2 of the present invention is actually used, positioning components 15 (such as screws, rivets or pins, etc.) or welding methods can be used to align and penetrate each positioning hole 121, each first positioning hole 130 and each second positioning hole 140, and the positioning components 15 are aligned with each first positioning hole 130, each positioning notch 131, each positioning hole 121, each positioning notch 122 and each second positioning hole 140, for the device body 1 to be fixed on the preset device, which can be the mainframe, chassis or heat source (chip, processor or interface card) of electronic or electrical products (not shown in the figures). The limiting member 24 of the quick connector 2 is combined with the preset heat exchanger (not shown in the figures). The preset heat exchanger has a water (liquid) flow channel inside and is fixed on the surface of the heat source (chip, processor or interface card). The preset adapter 3 is assembled and plugged in the docking portion 22 of the quick connector 2, and the other side of the preset adapter 3 is assembled in the external preset water (liquid) cooling system (cooling water tank and pumping motor, etc., not shown in the figures). When the preset adapter 3 is inserted into the docking portion 22 of the quick connector 2, the quick connector 2 can form an elastic floating active displacement at the through hole 10 of the device body 1, so that the elastic floating offset between the docking portion 22 and the preset adapter 3 can be achieved (can be in an unspecified direction such as axial or radial direction), and the adjustment is quick, convenient for assembly and docking purposes, and has the function of elastic adjustment. Moreover, when the quick connector 2 and the preset adapter 3 are used for plugging, they are not easily affected by the direction, angle or space restrictions of the installation location.

The above descriptions are only preferred embodiments of the present invention and do not limit the patent scope of the present invention. Therefore, all simple modifications and equivalent structural changes made by using the description and drawings of the present invention shall be included in the patent scope of the present invention and shall be clearly stated.

In summary, the above-mentioned blind-mating floating clamp device of the present invention can indeed achieve its effect and purpose when used. Therefore, this invention is truly an invention with excellent practicality and meets the application requirements for an invention patent. I file the application in accordance with the law and hope that the review committee will approve this case as soon as possible to protect the inventor's hard work. If the review committee has any doubts, please feel free to send us a letter for instructions. The inventor will try our best to cooperate. We sincerely appreciate it.

What the invention claimed is:

1. A blind-mating floating clamp device, comprising a device body and an elastic member assembled inside said device body, said device body having two opposite side surfaces respectively provide a through hole penetrating said device body, and a diameter of each said through hole being larger than an inner diameter of said elastic member and smaller than an outer diameter of said elastic member, wherein said device body comprises a base and two outer covers assembled on two opposite surfaces of said base, said base defining therein an accommodation space for assembling said elastic member, the two outer covers being respectively provided with one respective said through hole of said device body with the diameter smaller than a width of said accommodation space, wherein the two outer covers assembled on the two opposite surfaces of said base are respectively defined as a first outer cover and a second outer cover, said first outer cover being provided with a first one of the through holes of the two outer covers, said second outer cover being provided with a second one of the through holes of the two outer covers, and wherein said base comprises a plurality of positioning holes and positioning notches respectively located at corners thereof for mounting; said first outer cover comprises a plurality of first positioning holes and first positioning notches respectively located at corners thereof and respectively corresponding to the positioning holes and positioning notches of said base; said second outer cover comprises a plurality of second positioning holes respectively located at corners thereof and respectively corresponding to the positioning holes and positioning notches of said base and the first positioning holes and first positioning notches of said first outer cover.

2. The blind-mating floating clamp device as claimed in claim 1, wherein said elastic member is curve-shaped, and is elastically held in an interference manner on an inner wall surface of said accommodation space.

3. A blind-mating floating clamp device comprising a device body, an elastic member and a quick connector, said elastic member assembled inside said device body, said device body having two opposite side surfaces respectively provide a through hole penetrating said device body, a diameter of each said through hole being larger than an inner diameter of said elastic member and smaller than an outer diameter of said elastic member, said quick connector being movably inserted into the through holes of said device body, said quick connector comprising a shank being movably held at the inner diameter of said elastic member, and a docking portion located in said shank is able to be assembled with a corresponding preset adapter, wherein said quick connector further comprises a connector body and a limiting member assembled on one side of said connector body, said connector body being combined with said shank, said limiting member being located outside the through hole on one side of said device body.

4. The blind-mating floating clamp device as claimed in claim 3, wherein said device body comprises a base and two outer covers assembled on two opposite surfaces of said base, said base defining therein an accommodation space for assembling said elastic member, the two outer covers being respectively provided with one respective said through hole of an inside of said device body with the diameter smaller than a width of said accommodation space.

5. The blind-mating floating clamp device as claimed in claim 4, wherein the two outer covers assembled on the two opposite surfaces of said base are respectively defined as a first outer cover and a second outer cover, said first outer cover being provided with a first one of the through holes of the two outer covers, said second outer cover being provided with a second one of the through holes of the two outer covers.

6. The blind-mating floating clamp device as claimed in claim 5, wherein said base comprises a plurality of positioning holes and positioning notches respectively located at corners thereof for mounting; said first outer cover comprises a plurality of first positioning holes and first positioning notches respectively located at corners thereof and respectively corresponding to the positioning holes and positioning notches of said base; said second outer cover comprises a plurality of second positioning holes respectively located at corners thereof and respectively corresponding to the positioning holes and positioning notches of said base and the first positioning holes and first positioning notches of said first outer cover.

7. The blind-mating floating clamp device as claimed in claim 4, wherein said elastic member is curve-shaped, and is elastically held in an interference manner on an inner wall surface of said accommodation space.

8. The blind-mating floating clamp device as claimed in claim 3, wherein said connector body is provided with a connecting portion on one end of said shank, said connecting portion being assembled and combined with said limiting member through one of thread locking, interference fitting and welding.

9. The blind-mating floating clamp device as claimed in claim 3, wherein said connector body is provided with an annular flange on one end of said shank to expose an outside of said base and a connecting portion on an opposite end of said shank for said limiting member to be assembled and combined; said limiting member assembled on said connecting portion and said connecting portion is clamped on an outside of one of the two sides of the through hole of said device body to allow said shank to be movable through the through holes of said device body and resist the inner diameter of said elastic member.

* * * * *